(12) United States Patent
Wei et al.

(10) Patent No.: US 9,356,208 B2
(45) Date of Patent: May 31, 2016

(54) MANUFACTURING METHOD OF PIXEL STRUCTURE

(71) Applicant: Au Optronics Corporation, Hsinchu (TW)

(72) Inventors: Chuan-Sheng Wei, Taichung (TW); Chau-Shiang Huang, Keelung (TW); Wu-Liu Tsai, Hualien County (TW); Chih-Hung Lin, Taoyuan County (TW); Maw-Song Chen, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 370 days.

(21) Appl. No.: 14/038,774

(22) Filed: Sep. 27, 2013

(65) Prior Publication Data

US 2014/0030831 A1 Jan. 30, 2014

Related U.S. Application Data

(62) Division of application No. 13/402,883, filed on Feb. 23, 2012, now Pat. No. 8,581,255.

(30) Foreign Application Priority Data

Nov. 17, 2011 (TW) .............................. 100142006 A

(51) Int. Cl.
*H01L 33/58* (2010.01)
*H01L 27/12* (2006.01)
*G02F 1/1362* (2006.01)

(52) U.S. Cl.
CPC .......... *H01L 33/58* (2013.01); *G02F 1/136213* (2013.01); *G02F 1/136227* (2013.01); *H01L 27/1255* (2013.01)

(58) Field of Classification Search
CPC ................ H01L 27/1255; H01L 33/58; G02F 1/136213; G02F 1/136227
See application file for complete search history.

(56) References Cited

U.S. PATENT DOCUMENTS

| | | | | |
|---|---|---|---|---|
| 5,517,342 A | * | 5/1996 | Kim ..................... | H01L 27/1255 349/139 |
| 2004/0257489 A1 | * | 12/2004 | Gotoh ............... | G02F 1/136209 349/44 |
| 2008/0067519 A1 | * | 3/2008 | Sakurai ............. | G02F 1/136213 257/72 |

FOREIGN PATENT DOCUMENTS

| | | |
|---|---|---|
| CN | 2735379 | 10/2005 |
| CN | 102064180 | 5/2011 |

* cited by examiner

*Primary Examiner* — Marvin Payen
*Assistant Examiner* — Victor Barzykin
(74) *Attorney, Agent, or Firm* — Jianq Chyun IP Office

(57) ABSTRACT

A manufacturing method of pixel structure includes forming a first conductive layer on a substrate and forming a first insulation layer thereon; forming a second conductive layer on the first insulation layer; forming a second insulation layer on the second conductive layer; forming a semiconductor layer on the second insulation layer above the gate; forming a third conductive layer on the second insulation layer, wherein the gate, the semiconductor layer, the source, and the drain together constitute a thin film transistor, and the first electrode, the second electrode, and the third electrode together constitute a capacitor; forming a third insulation layer on the third conductive layer; and forming a pixel electrode on the third insulation layer, the pixel electrode being electrically connected to the drain.

10 Claims, 9 Drawing Sheets

MANUFACTURING METHOD OF PIXEL STRUCTURE

CROSS-REFERENCE TO RELATED APPLICATION

This application is a divisional application of and claims the priority benefit of a prior application Ser. No. 13/402,883, filed on Feb. 23, 2012, now allowed, which claims the priority benefit of Taiwan application serial no. 100142006, filed on Nov. 17, 2011. The entirety of each of the above-mentioned patent applications is hereby incorporated by reference herein and made a part of specification.

BACKGROUND OF THE INVENTION

1. Field of the Invention

The invention relates to a pixel structure and a manufacturing method thereof.

2. Description of Related Art

In general, a pixel structure of a liquid crystal display (LCD) includes a thin film transistor (TFT) and a pixel electrode. The TFT serves as a switching device of an LCD unit. To control each individual pixel structure, a certain pixel is usually selected according to a corresponding scan line and a corresponding data line, and display information corresponding to the certain pixel is displayed through providing an appropriate operating voltage. The pixel structure further includes a storage capacitor, such that the pixel structure can be equipped with a voltage-retaining function. Namely, the storage capacitor can store the applied operating voltage to stabilize the display image of the pixel structure.

To form the storage capacitor in the pixel structure, a capacitor electrode is often required in the pixel structure. However, in order to increase the capacitance of the storage capacitor, the area occupied by the capacitor electrode need be expanded, thus reducing the aperture ratio of the pixel structure.

At present, a pixel structure in which the capacitor electrode is disposed below the data line has been proposed to increase the aperture ratio of the pixel structure. However, the capacitor electrode and the data line which are overlapped increase the loading of the pixel structure. Therefore, in the pixel structure, the required power consumption for driving the display panel is increased in the pixel structure.

SUMMARY OF THE INVENTION

The invention is directed to a pixel structure and a manufacturing method thereof, and the pixel structure can have a high aperture ratio without increasing the loading of the pixel structure.

In the invention, a pixel structure that includes a first electrode, a first insulation layer, a gate, a second electrode, a second insulation layer, a semiconductor layer, a source and a drain, a third electrode, a third insulation layer, and a pixel electrode is provided. The first electrode is located on a substrate. The first insulation layer covers the first electrode. The gate is located on the first insulation layer. The second electrode is located on the first insulation layer above the first electrode. The second insulation layer covers the gate and the second electrode. The semiconductor layer is located on the second insulation layer above the gate. The source and the drain are located on the semiconductor layer. Here, the gate, the semiconductor layer, the source, and the drain together constitute a TFT. The third electrode is located on the second insulation layer above the second electrode and the third electrode is electrically connected to the first electrode. Here, the first electrode, the second electrode, and the third electrode together constitute a capacitor. The third insulation layer covers the source, the drain, and the third electrode. The pixel electrode is located on the third insulation layer and electrically connected to the drain.

In the invention, a manufacturing method of a pixel structure is also provided. In the manufacturing method, a first conductive layer is formed on a substrate, and the first conductive layer includes a first electrode. A first insulation layer is formed on the first conductive layer. A second conductive layer is formed on the first insulation layer. The second conductive layer includes a gate and a second electrode, and the second electrode is located above the first electrode. A second insulation layer is formed on the second conductive layer. A semiconductor layer is formed on the second insulation layer above the gate. A third conductive layer is formed on the second insulation layer. The third conductive layer includes a source, a drain, and a third electrode. The source and the drain are located on the semiconductor layer, and the third electrode is located above the second electrode and electrically connected to the first electrode. Here, the gate, the semiconductor layer, the source, and the drain together constitute a TFT, and the first electrode, the second electrode, and the third electrode together constitute a capacitor. A third insulation layer is formed on the third conductive layer. A pixel electrode is formed on the third insulation layer, and the pixel electrode is electrically connected to the drain.

Based on the above, the capacitor described herein is constituted by the first electrode, the second electrode, and the third electrode, and the first electrode is located below the first insulation layer that is below the second electrode. Hence, in the invention, the storage capacitance of the capacitor can be increased without negatively affecting the aperture ratio of the pixel structure; what is more, a display with high resolution can be formed. From another aspect, since the first, second, and third electrodes of the capacitor are not configured below the data line, the capacitor described herein does not lead to an increase in the loading of the pixel structure.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

FIG. 2 is taken along section lines I-I' and II-II' corresponding to the cross-sectional views in FIG. 1A to FIG. 1I.

DESCRIPTION OF EMBODIMENTS

FIG. 1A through 1I are schematic cross-sectional views illustrating a process of fabricating a pixel structure according to an embodiment of the invention. FIG. 2 is a schematic top view illustrating a pixel structure according to an embodiment of the invention. Here, FIG. 2 is taken along section lines I-I' and II-II' corresponding to the cross-sectional views in FIG. 1A to FIG. 1I.

Figure 1A:
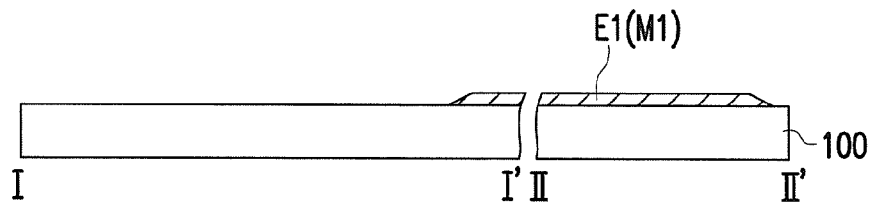
FIG. 1A through 1I are schematic cross-sectional views illustrating a process of fabricating a pixel structure according to an embodiment of the invention.
Figure 2:
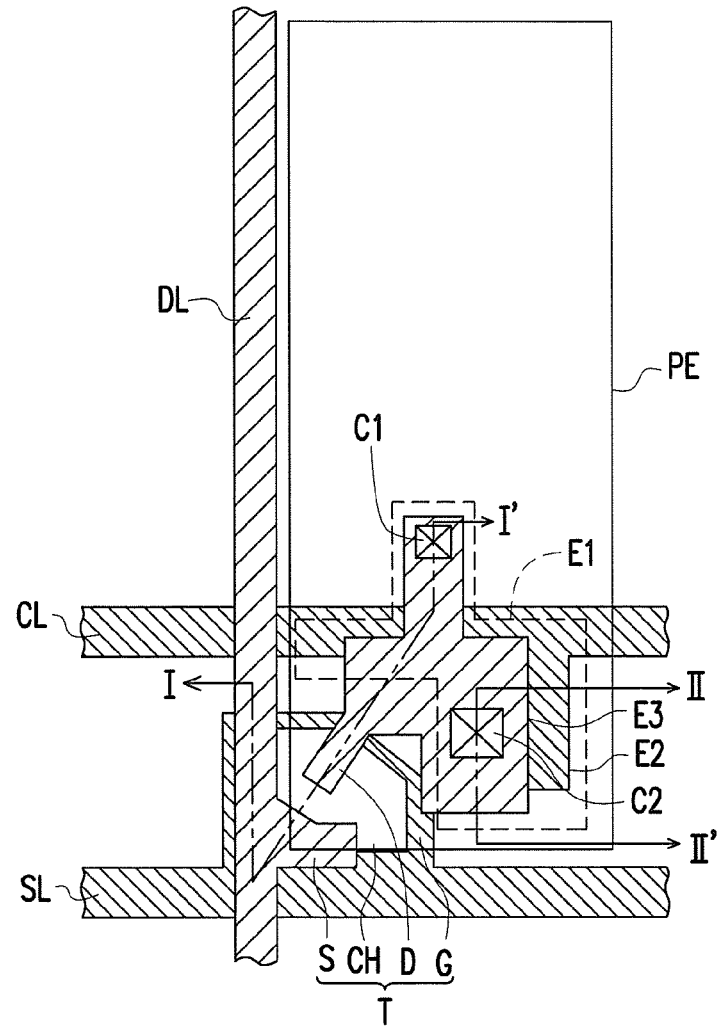
FIG. 2 is a schematic top view illustrating a pixel structure according to an embodiment of the invention. Here.

With reference to FIG. 1A, in the present embodiment, a first conductive layer M1 is formed on a substrate 100, and the first conductive layer M1 includes a first electrode E1. The substrate 100 can be made of glass, quartz, an organic polymer, an opaque/reflective material (such as a conductive material, wafer, ceramics, or any other appropriate material), or any other appropriate material. A material of the first conductive layer M1 (the first electrode E1) includes metal, an alloy, metal nitride, metal oxide, metal oxynitride, another appropriate material, or a layer in which a metal material and any other conductive material are stacked together. A method of forming the first conductive layer M1 (the first electrode E1) includes performing a deposition process to deposit a conductive material layer and performing a photolithography and etching process to pattern the conductive material layer, for instance.

Figure 1B:
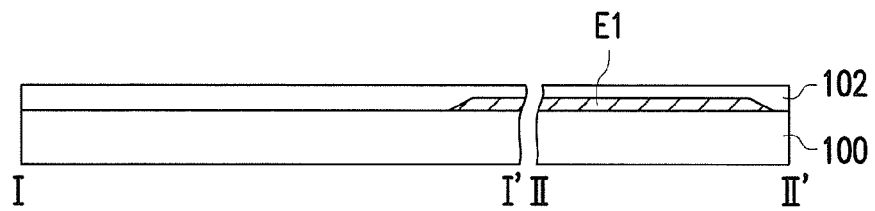

With reference to FIG. 1B, a first insulation layer 102 is formed on the first conductive layer M1 (the first electrode E1). A material of the first insulation layer 102 includes an inorganic insulation material (e.g., silicon oxide, silicon nitride, silicon oxynitride, or any other appropriate dielectric material) or an organic insulation material. The first insulation layer 102 is formed by performing a chemical vapor deposition (CVD) process, a physical vapor deposition (PVD) process, or a coating process, for instance.

Figure 1C:
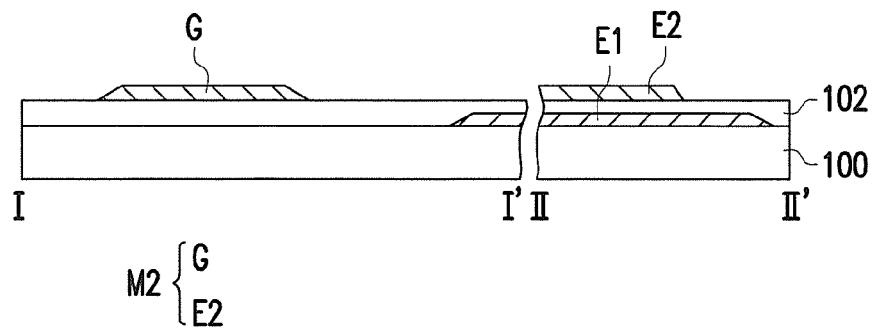

With reference to FIG. 1C, a second conductive layer M2 is formed on the first insulation layer 102, and the second conductive layer M2 includes a gate G and a second electrode E2 that is located above the first electrode E1. According to the present embodiment, the second conductive layer M2 further includes a scan line SL and an electrode line CL (as shown in FIG. 2); the scan line SL is electrically connected to the gate G, and the electrode line CL is electrically connected to the second electrode E2. A material of the second conductive layer M2 includes metal, an alloy, metal nitride, metal oxide, metal oxynitride, another appropriate material, or a layer in which a metal material and any other conductive material are stacked together. A method of forming the second conductive layer M2 includes performing a deposition process to deposit a conductive material layer and performing a photolithography and etching process to pattern the conductive material layer, for instance.

Figure 1D:
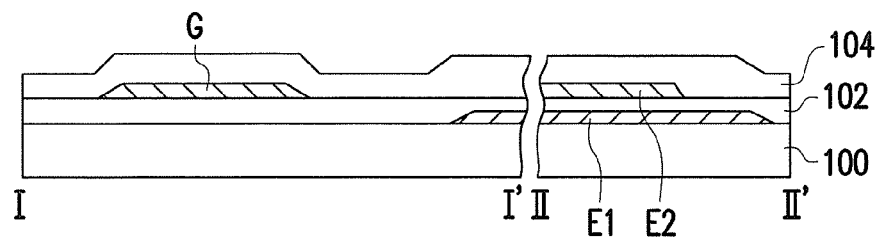

With reference to FIG. 1D, a second insulation layer 104 is formed on the second conductive layer M2 (the gate G and the second electrode E2). A material of the second insulation layer 104 includes an inorganic insulation material (e.g., silicon oxide, silicon nitride, silicon oxynitride, or any other appropriate dielectric material) or an organic insulation material. The second insulation layer 104 is formed by performing a CVD process, a PVD process, or a coating process, for instance.

Figure 1E:
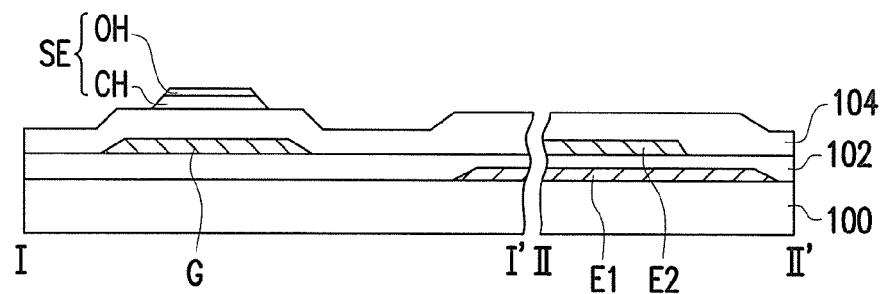

With reference to FIG. 1E, a semiconductor layer SE is formed on the second insulation layer 104 above the gate G. According to the present embodiment, the semiconductor layer SE includes a channel layer CH and an ohmic contact layer OH. A method of forming the semiconductor layer SE includes performing a deposition process to sequentially deposit a channel material layer and an ohmic contact material layer and performing a photolithography and etching process to pattern the two material layers, for instance. However, the semiconductor layer SE is not required to include both the channel layer CH and the ohmic contact layer OH in the invention; namely, according to another embodiment, the semiconductor layer SE may merely contain the channel layer CH.

Figure 1F:
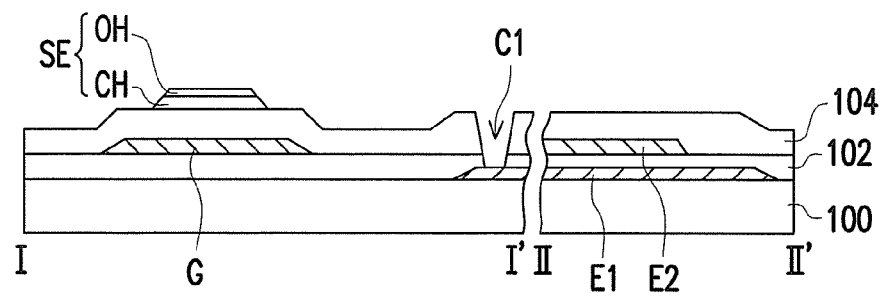

With reference to FIG. 1F, the second insulation layer 104 is patterned to form a contact opening C1 that exposes the first electrode E1.

Figure 1G:
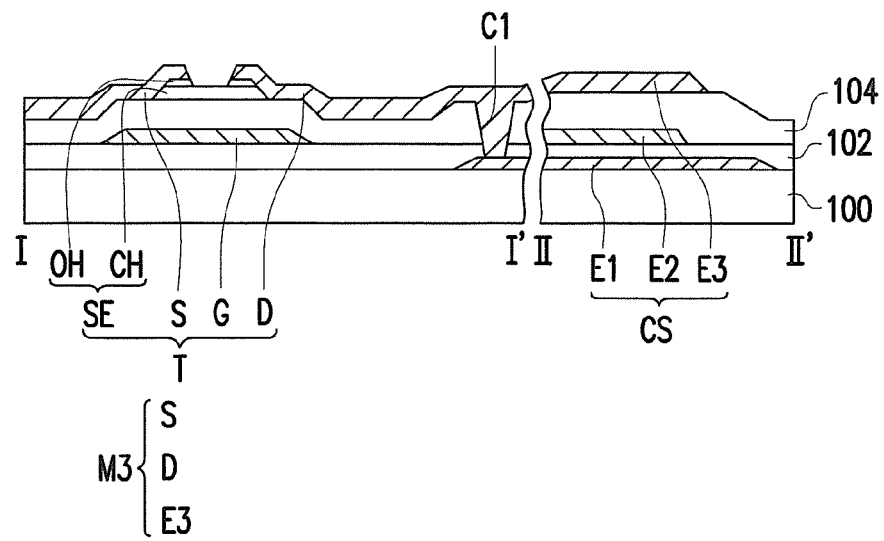

With reference to FIG. 1G, a third conductive layer M3 is formed on the second insulation layer 104, and the third conductive layer M3 includes a source S, a drain D, and a third electrode E3. Here, the third conductive layer M3 may further include a data line DL. The source S and the drain D are located on the semiconductor layer SE, the third electrode E3 is located above the second electrode E2, and the data line DL is electrically connected to the source S. According to the present embodiment, the drain D is connected to the third electrode E3; thus, the drain D is electrically connected to the third electrode E3. Here, the gate G, the semiconductor layer SE, the source S, and the drain D together constitute a TFT T, and the first, second, and third electrodes E1, E2, and E3 together constitute a capacitor CS. Besides, the third electrode E3 is electrically connected to the first electrode E1 through the contact opening C1 formed in the second insulation layer 104.

It should be mentioned that the contact opening C1 for electrically connecting the first and third electrodes E1 and E3 is disposed at a region away from the TFT T according to the present embodiment. This is mainly to prevent the contact opening C1 from causing short circuit between the electrode (the gate G) of the TFT T and the electrode (the second electrode E2) of the capacitor CS. However, the location of the contact opening C1 is not limited in the invention; as a matter of fact, the contact opening C1 can be located at any region where the first and third electrodes E1 and E3 are overlapped without causing short circuit between the TFT T and the capacitor CS.

Figure 1H:
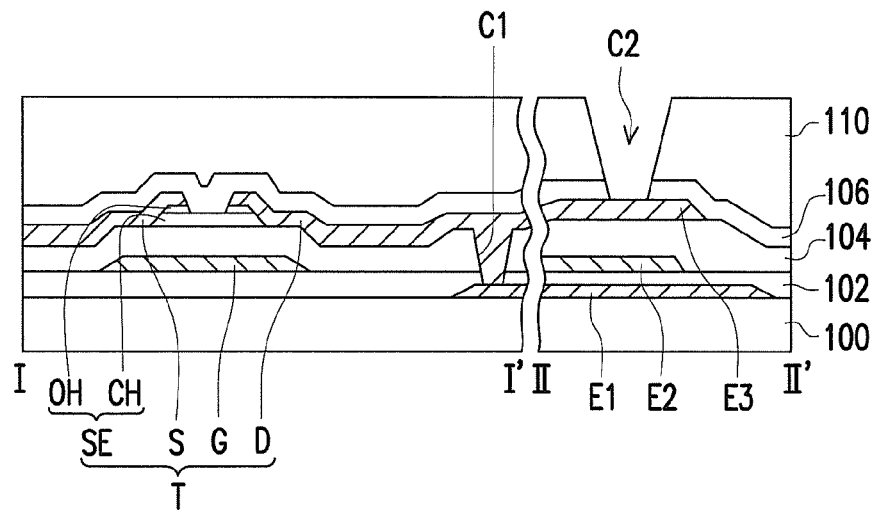

With reference to FIG. 1H, a third insulation layer (106, 110) is formed on the third conductive layer M3 (the source S, the drain D, and the third electrode E3). In the present embodiment, the third insulation layer includes a passivation layer 106 and a planarization layer 110, which should not be construed as a limitation to the invention. In another embodiment, the third insulation layer may also contain one of the passivation layer 106 and the planarization layer 110. The third insulation layer 110, 106 is patterned to form a contact opening C2, and the contact opening C2 exposes the third electrode E3.

Figure 1I:
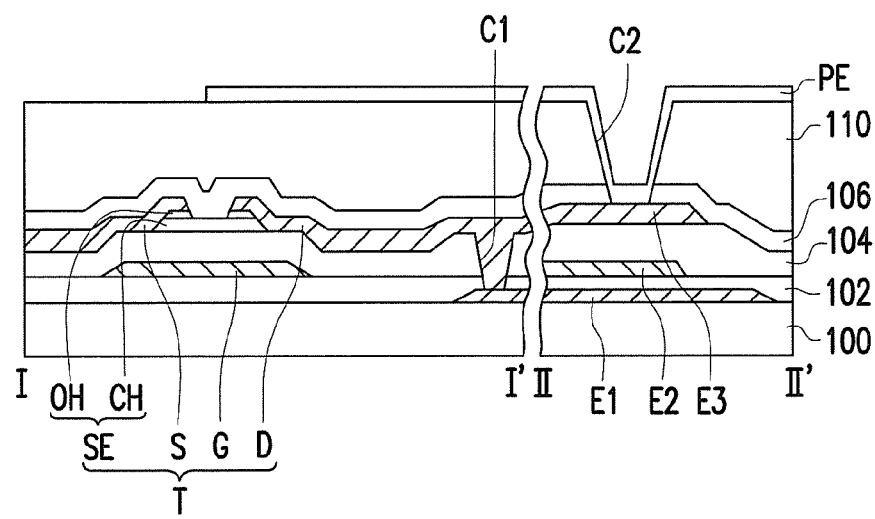

With reference to FIG. 1I, a pixel electrode PE is formed on the third insulation layer 106, 110, and the pixel electrode PE is electrically connected to the drain D. According to the present embodiment, the contact opening C2 is located on and exposes the third electrode E3, and thus the pixel electrode PE can be electrically connected to the third electrode E3 through the contact opening C2. Since the drain D is directly connected to the third electrode E3, the pixel electrode PE can be electrically connected to the drain D through the contact opening C2 and the third electrode E3. The pixel electrode PE may be a transparent pixel electrode, a reflective pixel electrode, or a combination of the transparent pixel electrode and the reflective pixel electrode. A material of the transparent pixel electrode may include metal oxide, such as indium tin oxide (ITO), indium zinc oxide (IZO), aluminum tin oxide (ATO), aluminum zinc oxide (AZO), indium germanium zinc oxide, other suitable oxide, or a stacked layer having at least two of the above materials. The reflective pixel electrode is made of a metal material that is characterized by high reflectivity, for instance.

The pixel structure formed by conducting the aforesaid method is shown in FIG. 1I and FIG. 2, and the pixel structure includes the first electrode E1, the first insulation layer 102, the gate G, the second electrode E2, the second insulation layer 104, the semiconductor layer SE, the source S and the drain D, the third electrode E3, the third insulation layer 106, 110, and the pixel electrode PE. The first electrode E1 is located on the substrate 100. The first insulation layer 102 covers the first electrode E1. The gate G is located on the first insulation layer 102. The second electrode E2 is located on the first insulation layer 102 above the first electrode E1. The second insulation layer 104 covers the gate G and the second electrode E2. The semiconductor layer SE is located on the second insulation layer 104 above the gate G. The source S and the drain D are located on the semiconductor layer SE. The gate G, the semiconductor layer SE, the source S, and the drain D together constitute a TFT T. The third electrode E3 is located on the second insulation layer 104 above the second electrode E2. Here, the third electrode E3 is electrically connected to the first electrode E1, and the first electrode E1, the second electrode E2, and the third electrode E3 together constitute the capacitor CS. The third insulation layer 106, 110 covers the source S, the drain D, and the third electrode E3. The pixel electrode PE is located on the third insulation layer 110 and electrically connected to the drain D.

It should be mentioned that the TFT T and the capacitor CS in the pixel structure shown in FIG. 2 are located at the edge portion of the pixel structure (the pixel electrode PE). However, the invention is not limited thereto, and the TFT T and the capacitor CS in another embodiment may be located at the central portion of the pixel structure (the pixel electrode PE).

In view of the previous embodiments, the capacitor CS is constituted by the first electrode E1, the second electrode E2, and the third electrode E3, and the first electrode E1 is located below the first insulation layer 102 that is below the second electrode E2. Hence, in the invention, the storage capacitance of the capacitor CS can be increased without negatively affecting the aperture ratio of the pixel structure. From another perspective, since the first, second, and third electrodes E1, E2, and E3 of the capacitor CS are not overlapped with the data line DL, the capacitance of the capacitor CS does not interfere with the data line DL and thus does not increase the loading of the pixel structure.

Figure 3:
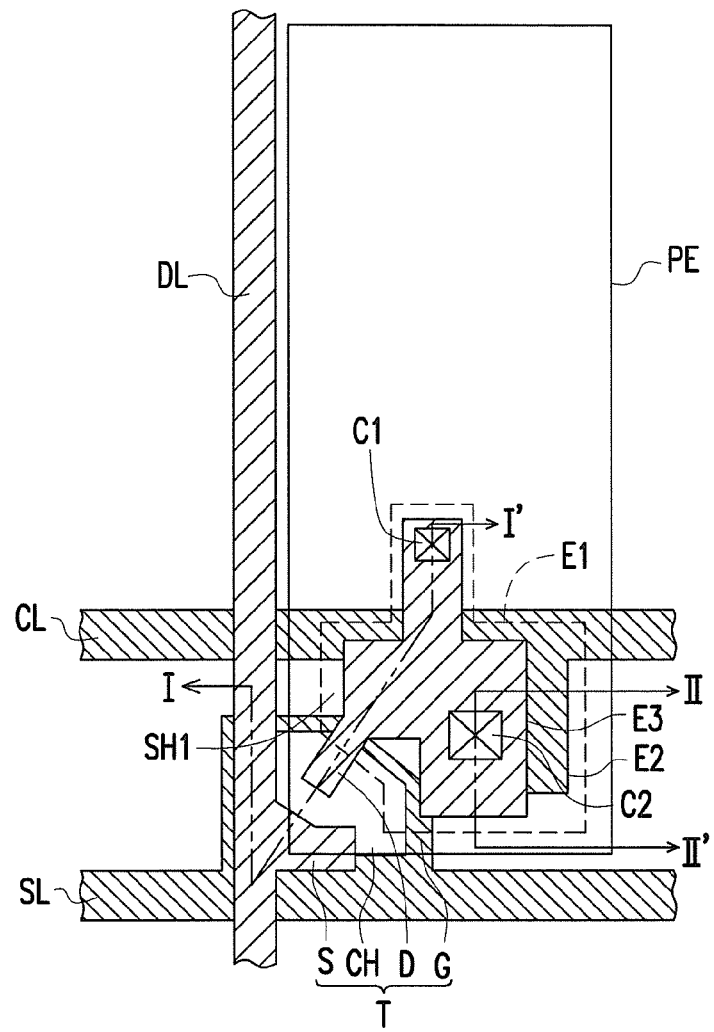
FIG. 3 is a schematic top view illustrating a pixel structure according to an embodiment of the invention.
Figure 4:
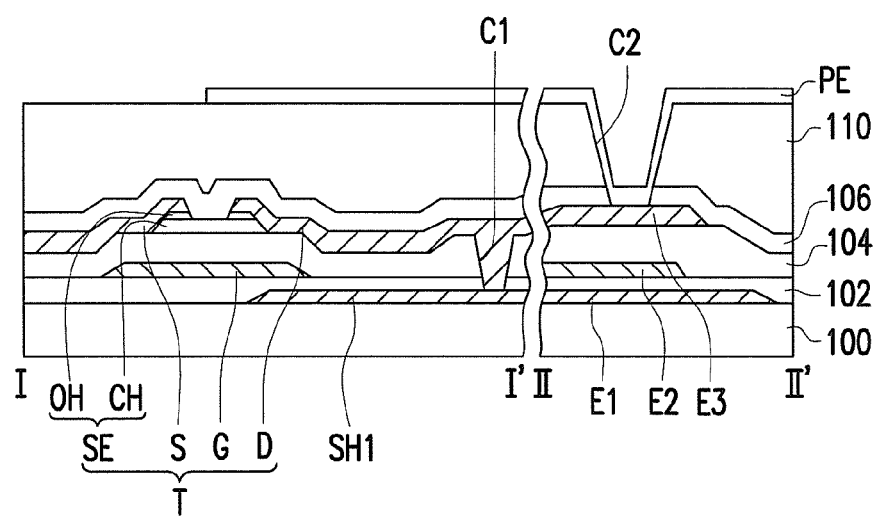
FIG. 4 is a schematic cross-sectional view illustrating the pixel structure taken along section lines I-I' and II-II' depicted in FIG. 3.

FIG. 3 is a schematic top view illustrating a pixel structure according to an embodiment of the invention. FIG. 4 is a schematic cross-sectional view illustrating the pixel structure taken along section lines I-I' and II-II' depicted in FIG. 3. With reference to FIG. 3 and FIG. 4, the embodiment shown herein is similar to the embodiment shown in FIG. 2, so that identical components in these figures will be denoted by the same numerals and will not be reiterated herein. In the present embodiment, the first conductive layer M1 not only includes the first electrode E1 but also includes a light shielding portion SH1. The light shielding portion SH1 is correspondingly disposed below and at one side of the gate G but does not extend to an underside of the data line DL. Here, the light shielding portion SH1 may be connected to the first electrode E1, and thus the light shielding portion SH1 and the first electrode E1 of the first conductive layer M1 constitute a lump or block pattern. That is to say, the light shielding portion SH1 extends from the first electrode E1 to an underside of the gate G.

The light shielding portion SH1 disposed below the gate G may shield the light from the backside of the substrate 100, so as to prevent the TFT T from generating photo-leakage current. In general, the liquid crystal is a non-self-illuminating display medium, and thus a backlight module is required to be additionally configured at the back side of the display panel for supplying the planar light source needed by the display panel. With the development of the display panel with high resolution, the light intensity of the backlight module need be improved to comply with the brightness standard required by the display panel with high resolution. Nonetheless, when the light intensity of the backlight module increases, the light is much more likely to cause photo-leakage current in the TFT in the display panel. Accordingly, the light shielding portion SH1 is configured in the first conductive layer in the present embodiment, so as to prevent the light coming from the backside of the substrate 100 (i.e., the light of the backlight module) from generating photo-leakage current in the TFT T. In other words, the light coming from the backside of the substrate 100 (the light of the backlight module), after being blocked by the light shielding portion SH1 and the gate G, can be precluded from entering the semiconductor layer SE, and thereby the issue of photo-leakage current does not arise in the TFT T.

Figure 5:
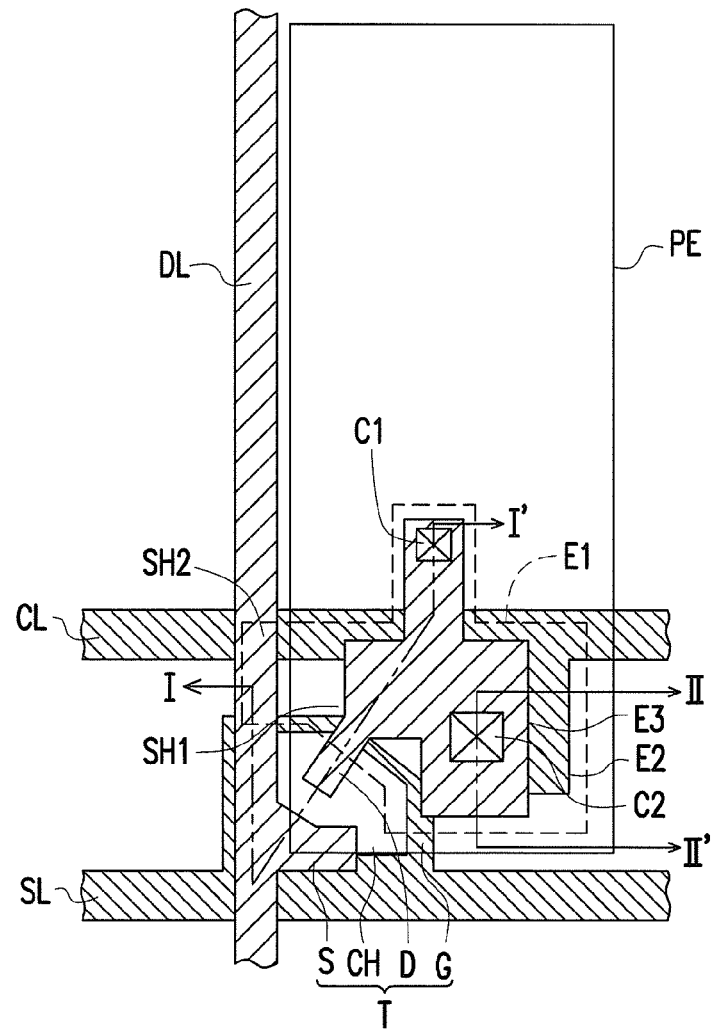
FIG. 5 is a schematic top view illustrating a pixel structure according to an embodiment of the invention.
Figure 6:
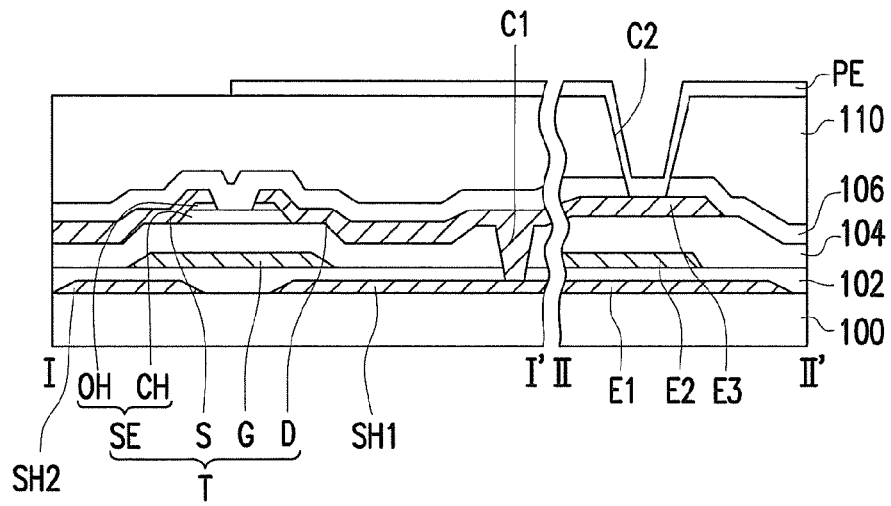
FIG. 6 is a schematic cross-sectional view illustrating the pixel structure taken along section lines I-I' and II-II' depicted in FIG. 5.

FIG. 5 is a schematic top view illustrating a pixel structure according to an embodiment of the invention. FIG. 6 is a schematic cross-sectional view illustrating the pixel structure taken along section lines I-I' and II-II' depicted in FIG. 5. With reference to FIG. 5 and FIG. 6, the embodiment shown herein is similar to the embodiment shown in FIG. 2, so that identical components in these figures will be denoted by the same numerals and will not be reiterated herein. In the present embodiment, the first conductive layer M1 not only includes the first electrode E1 but also includes a light shielding portion SH1 and a light shielding portion SH2. The light shielding portions SH1 and SH2 are correspondingly disposed below and respectively at two sides of the gate G and extend to an underside of the data line DL. Here, the light shielding portions SH1 and SH2 may be connected to the first electrode E1, and thus the light shielding portions SH1 and SH2 and the first electrode E1 of the first conductive layer M1 constitute a lump or block pattern.

Similarly, the light shielding portions SH1 and SH2 configured below the gate G may shield the light from the underside of the substrate 100, so as to prevent the TFT T from generating photo-leakage current. In other words, the light coming from the underside of the substrate 100 (the light of the backlight module), after being blocked by the light shielding portions SH1 and SH2 and the gate G, can be precluded from entering the semiconductor layer SE, and thereby the issue of photo-leakage current does not arise in the TFT T.

Figure 7:
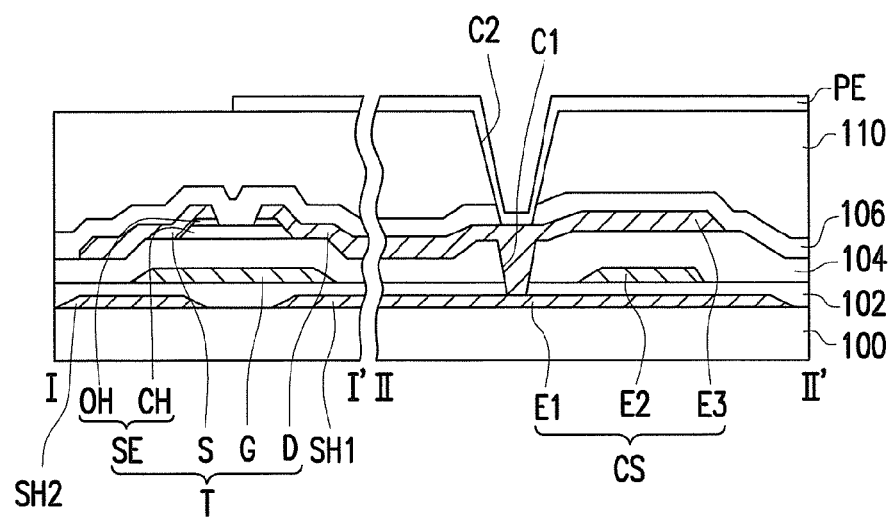
FIG. 7 is a schematic cross-sectional view illustrating a pixel structure according to another embodiment of the invention.
Figure 8:
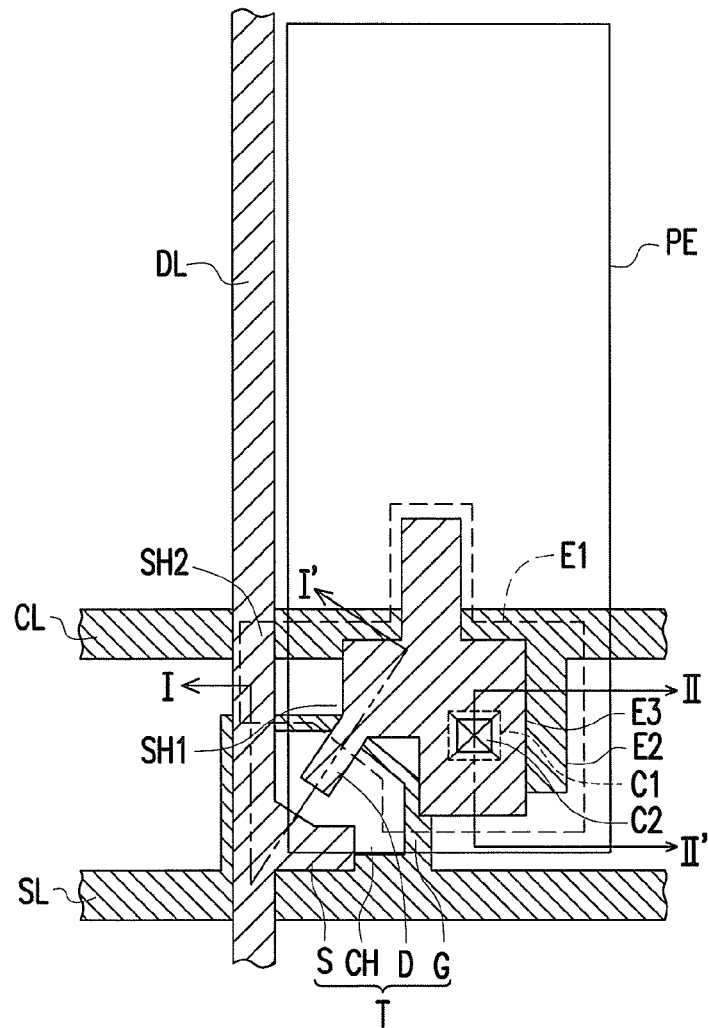
FIG. 8 is a schematic top view illustrating a pixel structure according to an embodiment of the invention.

FIG. 7 is a schematic cross-sectional view illustrating a pixel structure according to another embodiment of the invention. FIG. 8 is a schematic top view illustrating a pixel structure according to an embodiment of the invention. Specifically, the cross-sectional view taken along the sectional lines I-I' and II-II' of FIG. 8 is shown in FIG. 7. With reference to FIG. 7 and FIG. 8, the embodiment shown herein is similar to the embodiment shown in FIG. 6, so that identical components in these figures will be denoted by the same numerals and will not be reiterated herein. In this embodiment, the contact opening C1 is located between the gate G and the second electrode E2. The gate G and the second electrode E2 both belong to the second conductive layer M2; therefore, when the contact opening C1 is defined, the contact opening C1 need be located at a region where the gate G and the second electrode E2 are not located, so as to prevent the subsequent short circuit between the gate G and the second electrode E2. Besides, in the present embodiment, the contact opening C2 is located above the contact opening C1. However, the contact opening C2 is not necessarily located right above the contact opening C1 in the invention.

In light of the foregoing, the capacitor described herein is constituted by the first electrode, the second electrode, and the third electrode, and the first electrode is located below the first insulation layer that is below the second electrode. Hence, in the invention, the storage capacitance of the capacitor can be increased without negatively affecting the aperture ratio of the pixel structure. From another aspect, since none of the first, second, and third electrodes of the capacitor are configured below the data line, the capacitor described herein does not lead to an increase in the loading of the pixel structure. Moreover, the light shielding portion disposed below the gate may shield the light from the underside of the substrate, so as to prevent the TFT from generating photo-leakage current.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A manufacturing method of a pixel structure, comprising:
    forming a first conductive layer on a substrate, the first conductive layer comprising a first electrode;
    forming a first insulation layer on the first conductive layer;
    forming a second conductive layer on the first insulation layer, the second conductive layer comprising a gate and a second electrode, the second electrode being located above the first electrode;
    forming a second insulation layer on the second conductive layer;
    forming a semiconductor layer on the second insulation layer above the gate, wherein the second electrode and the semiconductor layer do not overlap each other;
    forming a third conductive layer on the second insulation layer, the third conductive layer comprising a source, a drain and a third electrode, the source and the drain being located on the semiconductor layer, the third electrode being located above the second electrode and electrically connected to the first electrode, wherein the gate, the semiconductor layer, the source, and the drain together constitute a thin film transistor, and the first electrode, the second electrode, and the third electrode together constitute a capacitor;
    forming a third insulation layer on the third conductive layer; and
    forming a pixel electrode on the third insulation layer, the pixel electrode being electrically connected to the drain.

2. The manufacturing method as recited in claim 1, wherein the first conductive layer further comprises a light shielding portion correspondingly disposed below the gate.

3. The manufacturing method as recited in claim 2, wherein the light shielding portion extends from the first electrode to an underside of the gate.

4. The manufacturing method as recited in claim 2, wherein the light shielding portion shields one side of the gate and does not extend to an underside of a data line.

5. The manufacturing method as recited in claim 2, wherein the light shielding portion shields two sides of the gate and extends to an underside of a data line.

6. The manufacturing method as recited in claim 1, wherein the drain is connected to the third electrode.

7. The manufacturing method as recited in claim 6, further comprising forming a contact opening in the third insulation layer to expose the third electrode, the pixel electrode being electrically connected to the third electrode through the contact opening.

8. The manufacturing method as recited in claim 1, further comprising forming a contact opening in the first and second insulation layers to expose the first electrode, the third electrode being electrically connected to the first electrode through the contact opening.

9. The manufacturing method as recited in claim 8, wherein the contact opening is located between the gate and the second electrode.

10. A manufacturing method of a pixel structure, comprising:
    forming a first conductive layer on a substrate, the first conductive layer comprising a first electrode and a light shielding portion;
    forming a first insulation layer on the first conductive layer;
    forming a second conductive layer on the first insulation layer, the second conductive layer comprising a gate and a second electrode, the second electrode being located above the first electrode, wherein the light shielding portion is correspondingly disposed below the gate and shields only one side of the gate and does not extend to an underside of a data line;
    forming a second insulation layer on the second conductive layer;
    forming a semiconductor layer on the second insulation layer above the gate;
    forming a third conductive layer on the second insulation layer, the third conductive layer comprising a source, a drain and a third electrode, the source and the drain being located on the semiconductor layer, the third electrode being located above the second electrode and electrically connected to the first electrode, wherein the gate, the semiconductor layer, the source, and the drain together constitute a thin film transistor, and the first electrode, the second electrode, and the third electrode together constitute a capacitor;
    forming a third insulation layer on the third conductive layer; and
    forming a pixel electrode on the third insulation layer, the pixel electrode being electrically connected to the drain.

* * * * *